United States Patent
Kiribuchi et al.

(10) Patent No.: US 11,461,515 B2
(45) Date of Patent: Oct. 4, 2022

(54) OPTIMIZATION APPARATUS, SIMULATION SYSTEM AND OPTIMIZATION METHOD FOR SEMICONDUCTOR DESIGN

(71) Applicants: KABUSHIKI KAISHA TOSHIBA, Minato-ku (JP); KIOXIA CORPORATION, Tokyo (JP)

(72) Inventors: Daiki Kiribuchi, Katsushika (JP); Takeichiro Nishikawa, Yokohama (JP); Satoru Yokota, Kawasaki (JP); Ryota Narasaki, Kawasaki (JP); Soh Koike, Tachikawa (JP)

(73) Assignees: KABUSHIKI KAISHA TOSHIBA, Minato-ku (JP); KIOXIA CORPORATION, Tokyo (JP)

( * ) Notice: Subject to any disclaimer, the term of this patent is extended or adjusted under 35 U.S.C. 154(b) by 347 days.

(21) Appl. No.: 16/296,549

(22) Filed: Mar. 8, 2019

(65) Prior Publication Data

US 2020/0050717 A1 Feb. 13, 2020

(30) Foreign Application Priority Data

Aug. 9, 2018 (JP) .............................. JP2018-150778

(51) Int. Cl.
*G06F 17/11* (2006.01)
*G06F 17/18* (2006.01)
(Continued)

(52) U.S. Cl.
CPC .............. *G06F 30/20* (2020.01); *G06F 17/11* (2013.01); *G06F 17/175* (2013.01); *G06F 17/18* (2013.01)

(58) Field of Classification Search
CPC ........ G06F 17/11; G06F 17/175; G06F 17/18; G06F 30/20
See application file for complete search history.

(56) References Cited

U.S. PATENT DOCUMENTS

| | | | |
|---|---|---|---|
| 7,428,514 B2* | 9/2008 | Jin | G06N 3/126 706/13 |
| 2003/0191728 A1* | 10/2003 | Kulkarni | G06N 3/086 706/21 |
| 2013/0133832 A1* | 5/2013 | Kuboi | H01J 37/32972 703/2 |

FOREIGN PATENT DOCUMENTS

| | | |
|---|---|---|
| JP | 4947903 | 6/2012 |
| JP | 2018-073360 | 5/2018 |
| WO | WO 2016/151864 A1 | 9/2016 |

OTHER PUBLICATIONS

Huntetal. "A guide to Matlab for Beginners and Experienced Users Second Edition". Cambridge University Press. www.cambridge.org/ 9780521850681.329 Pages. (Year: 2006).*

(Continued)

*Primary Examiner* — Eunhee Kim
(74) *Attorney, Agent, or Firm* — Oblon, McClelland, Maier & Neustadt, L.L.P.

(57) ABSTRACT

An optimization apparatus includes an output data acquirer to acquire output data expressing a result of experiment or simulation based input parameters, input/output data storage to store the input parameters and the output data corresponding to the input parameters, as a pair, an evaluation value calculator to calculate evaluation values of the output data, an input parameter converter to generate conversion parameters of a dimension number changed from the dimension number of the input parameters, a next-input parameter decider to decide next input parameters based on pairs of the conversion parameters and the evaluation values corresponding to the conversion parameters, and a repetition determiner to repeat operations of the output data acquirer, the input/output data storage, the evaluation value calculator, the input parameter converter, and the next-input parameter decider, until satisfying a predetermined condition.

15 Claims, 9 Drawing Sheets

(51) Int. Cl.
*G06F 17/17* (2006.01)
*G06F 30/20* (2020.01)

(56) References Cited

OTHER PUBLICATIONS

Lang et al. ("Reduced Order Model Based on Principal Component Analysis for Process Simulation and Optimization". Energy & Fuels 2009, 23, 1695-1706. (Year: 2009).*
Guhaniyogi et al. "Compressed Gaussian Process for Manifold Regression". Journal of Machine Learning Research 17 (2016) pp. 1-26. (Year: 2016).*

* cited by examiner

FIG. 2A

| x1 | 0.5 |
|---|---|
| x2 | 230 |
| x3 | 12 |
| ... | ... |
| x50 | 0.35 |

FIG. 2B

| y1 | 28 |
|---|---|
| y2 | 324 |
| y3 | 0.78 |
| ... | ... |
| y10 | 5010 |

| x1 | x2 | x3 | ... | x50 | y1 | y2 | y3 | ... | y10 |
|---|---|---|---|---|---|---|---|---|---|
| 0.32 | 120 | 4 | ... | 0.86 | 18 | 745 | 1.22 | ... | 3550 |
| 0.18 | 586 | 35 | ... | 0.21 | 24 | 612 | 0.93 | ... | 4780 |
| 0.3 | 422 | 29 | ... | 0.44 | 22 | 558 | 0.58 | ... | 4220 |
| ... | ... | ... | ... | ... | ... | ... | ... | ... | ... |
| 0.5 | 230 | 12 | ... | 0.35 | 28 | 324 | 0.78 | ... | 5010 |

FIG. 3

| x1 | x2 | x3 | ... | x50 | z1 | z2 | z3 | z4 | z5 |
|---|---|---|---|---|---|---|---|---|---|
| 0.32 | 120 | 4 | ... | 0.86 | 336 | 5.1 | 822 | 0.11 | 14 |
| 0.18 | 586 | 35 | ... | 0.21 | 253 | 8.1 | 3774 | 0.13 | 46 |
| 0.3 | 422 | 29 | ... | 0.44 | 559 | 9.7 | 3503 | 0.20 | 45 |
| ... | ... | ... | ... | ... | ... | ... | ... | ... | ... |
| 0.5 | 230 | 12 | ... | 0.35 | 462 | 6.7 | 1697 | 0.15 | 24 |

FIG. 4

| CONVERSION TERM |
| --- |
| y3 |
| y4 |
| y6 |
| y7 |
| y9 |

FIG. 7

OPTIMIZATION APPARATUS, SIMULATION SYSTEM AND OPTIMIZATION METHOD FOR SEMICONDUCTOR DESIGN

CROSS REFERENCE TO RELATED APPLICATIONS

This application is based upon and claims the benefit of priority from the prior Japanese Patent Application No. 2018-150778, filed on Aug. 9, 2018, the entire contents of which are incorporated herein by reference.

FIELD

Embodiments of the present disclosure relate to an optimization apparatus, a simulation system and an optimization method.

BACKGROUND

Simulators are utilized for various purposes. In order to simulate an operation in a complex event with a simulator, it is required to input a lot of input parameters to the simulator. When the values of the input parameters are changed, a result of simulation is also changed, so that a method has been proposed to search for optimum input parameters suitable for the operation in a real event has been proposed.

In such a conventional method, when the number of input parameters (also referred as a dimension number) is small, optimum input parameters can be set with a conventional optimization algorism. However, when the number of input parameters increases, the optimum input parameters may not be set within a practical time.

BRIEF DESCRIPTION OF THE DRAWINGS

FIG. 2A is a figure showing an example of input parameters;

FIG. 2B is a figure showing an example of output data;

FIG. 3 is a figure showing an example of data to be stored in input/output data storage;

FIG. 4 is a figure showing an example of input parameters and the corresponding conversion parameters arranged as a pair in the same row;

FIG. 7 is a figure showing an example of conversion terms input by a conversion term inputter;

DETAILED DESCRIPTION

According to the present embodiment, there is provided an optimization apparatus includes:

an output data acquirer to acquire output data showing a result of experiment or simulation based on input parameters;

input/output data storage to store the input parameters and the output data corresponding to the input parameters, as a pair;

an evaluation value calculator to calculate evaluation values of the output data;

an input parameter converter to generate conversion parameters of a dimension number changed from the dimension number of the input parameters;

a next-input parameter decider to decide next input parameters based on pairs of the conversion parameters and the evaluation values corresponding to the conversion parameters; and a repetition determiner to repeat operations of the output data acquirer, the input/output data storage, the evaluation value calculator, the input parameter converter, and the next-input parameter decider, until satisfying a predetermined condition.

Hereinafter, embodiments will now be explained with reference to the accompanying drawings. In the following embodiments, a unique configuration and operation of an optimization apparatus and a simulation apparatus will be mainly explained. However, the optimization apparatus and the simulation apparatus may have other configurations and operations omitted in the following explanation.

Figure 1:
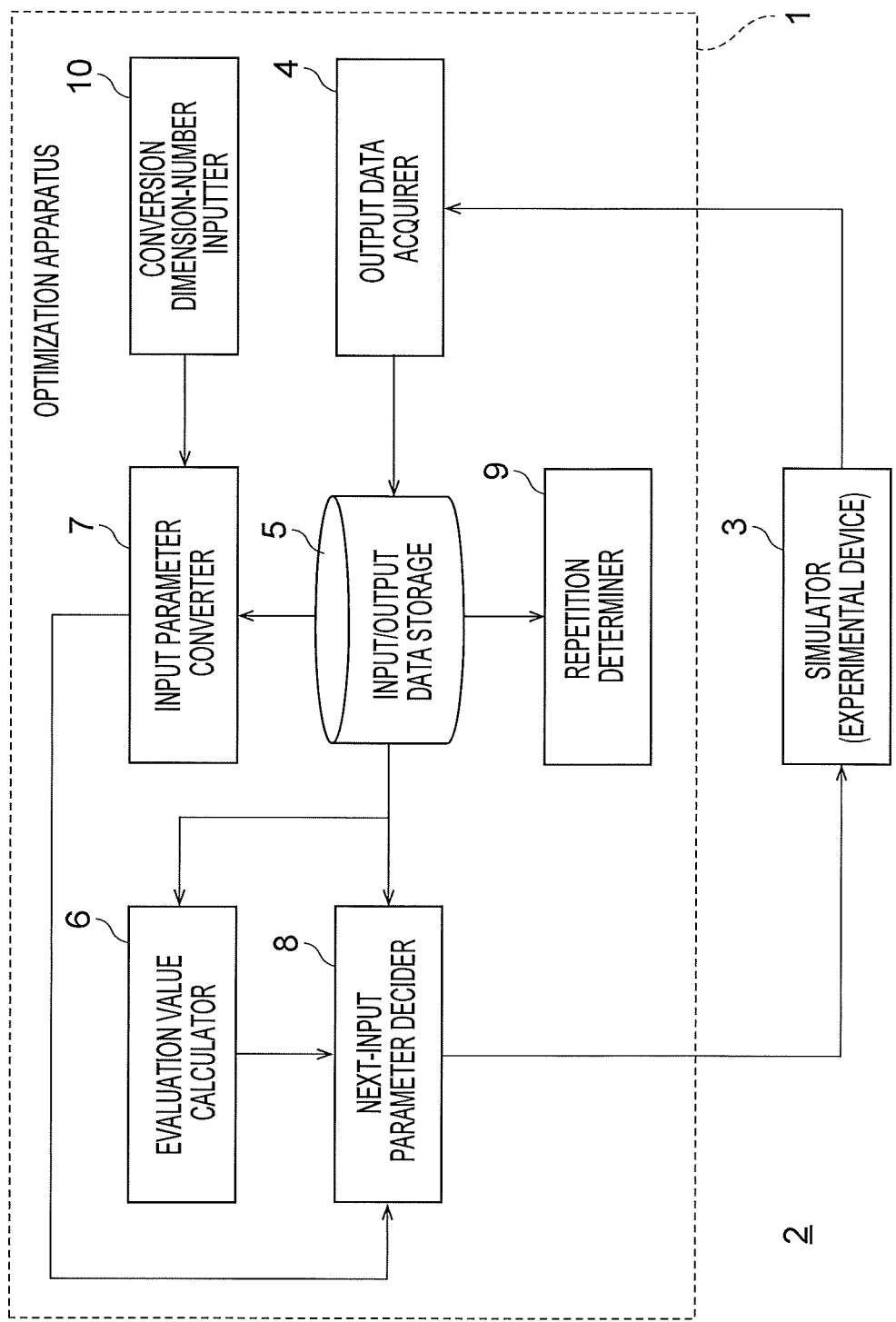
FIG. 1 a block diagram schematically showing the configuration of a simulation system provided with an optimization apparatus according to one embodiment.

FIG. 1 a block diagram schematically showing the configuration of a simulation system 2 provided with an optimization apparatus 1 according to one embodiment. The simulation system 2 of FIG. 1 is provided with the optimization apparatus 1 and a simulator 3. The simulator 3 performs simulation based on input parameters to output output data expressing a result of simulation. The optimization apparatus 1 optimizes input parameters to be input to (set in) the simulator 3.

The simulation system 2 of FIG. 1 can be configured with one or a plurality of computers. In this case, the one or plurality of computers execute a program for performing the operation of the optimization apparatus 1 and a program for performing the operation of the simulator 3. Or at least part of the operations of the optimization apparatus 1 and the simulator 3 may be performed by dedicated hardware (for example, a semiconductor device such as a signal processor).

The optimization apparatus 1 of FIG. 1 may not necessarily be connected to the simulator 3. For example, instead of the simulator 3, the optimization apparatus 1 of FIG. 1 may be used together with an experimental device for performing various experiments. In other words, the optimization apparatus 1 of FIG. 1 may not necessarily be built in the simulation system 2.

The optimization apparatus 1 of FIG. 1 has an output data acquirer 4, input/output data storage 5, an evaluation value calculator 6, an input parameter converter 7, a next-input parameter decider 8, a repetition determiner 9, and a conversion dimension-number inputter 10.

The output data acquirer 4 acquires output data expressing a result of experiment or simulation based on input parameters of a predetermined dimension number. In the present specification, it is a precondition that there are a plurality of input parameters to be used in experiment or to be input to the simulator 3. The number of input parameters (number of terms) is referred to as a dimension number. The output data acquirer 4 may, not only acquire output data expressing a result of simulation performed by the simulator 3, but also acquire output data expressing a result of experiment. Hereinafter, a process of acquiring the output data from the simulator 3 to decide next input parameters to the simulator 3 will be mainly explained. However, it is also possible to acquire output data from the experimental device, instead of the simulator 3, to decide the next input parameters to the experimental device.

The input/output data storage 5 stores the input parameters and the corresponding output data, as a pair. FIG. 2A is a figure showing an example of the input parameters. In the example of FIG. 2A, the input parameters include fifty terms of x1, x2, ... , and x50 which have values different from one another. The values of the terms may be continuous values, discrete values or categorical variables. Each term of the input parameters may be a physical parameter such as a temperature and pressure, or may be a parameter such as a process time and process condition related to experiments. The number of the terms of the input parameters and the contents of the terms can be freely decided.

FIG. 2B is a figure showing an example of the output data. In the example of FIG. 2B, the output data includes ten terms of y1, y2, ... , and y10 which have values different from one another. The output data expresses a result of experiment using the input parameters or a result of simulation by the simulator 3 to which the input parameters are input. In more specifically, the output data may be detected data of various sensors used in experiment or physical characteristic values or measured values in a result of experiment or simulation.

FIG. 3 is a figure showing an example of data to be stored in the input/output data storage 5. In the example of FIG. 3, the input parameters of FIG. 2A and the output data of FIG. 2B are stored, as pairs, in the input/output data storage 5.

The evaluation value calculator 6 calculates an evaluation value of the output data. The evaluation value is a one-dimensional value with respect to the input parameters. The evaluation value may be a piece of output data acquired as a result of experiment or simulation, or may be a value obtained by an arithmetic operation of a plurality of pieces of output data, acquired as a result of experiment or simulation, combined with one another. For example, a difference between output data acquired as a result of experiment or simulation and ideal output data may be used as the evaluation value. Or a value obtained by addition or multiplication of a plurality of pieces of output data acquired as a result of experiment or simulation may be used as the evaluation value.

The input parameter converter 7 generates conversion parameters of a dimension number changed from the dimension number of the input parameters. Changing the dimension number may be reduction of the dimension number. For example, the input parameter converter 7 converts input parameters x (=x1, x2, ... , x50) of a dimension number of 50 into conversion parameters z (=z1, z2, ... , z5) of a dimension number of 5. The dimension number of the conversion parameters z is decided by a dimension number input by the conversion dimension-number inputter 10. The conversion dimension-number inputter 10 may change the conversion dimension number during the operation of the optimization apparatus 1. Or the conversion dimension-number inputter 10 may be restricted so that it cannot change the conversion dimension number once input during the operation of the optimization apparatus 1. Moreover, it may be planned in advance to gradually increase the conversion dimension number as the optimization of the conversion dimension number proceeds.

A conversion process from the input parameters to the conversion parameters is expressed by a function $\phi(x)$ in the following expression (1).

$$z = \phi(x) \qquad (1)$$

The function $\phi(x)$ may be obtained, for example, by performing the principal component analysis (PCA). Or by using a random matrix A, the conversion parameters may be calculated as $z=Ax$. Or by using the multi-dimensional scaling, the self-organizing map, etc., the input parameters may be converted into the conversion parameters. Or by combining the above-described plurality of methods, the input parameters may be converted into the conversion parameters.

FIG. 4 is a figure showing an example of the input parameters and the corresponding conversion parameters arranged as a pair in the same row. The example shown in FIG. 4 is the conversion of input parameters x (=x1, x2, ... , x50) of a dimension number of 50 into conversion parameters z (=z1, z2, ... , z5) of a dimension number of 5. Each data in FIG. 4 may be stored in the input/output data storage 5 or storage not shown provided apart from the input/output data storage 5.

The next-input parameter decider 8 decides next input parameters to be used in experiment or to be input to the simulator 3 based on pairs of the above-described conversion parameters and the corresponding evaluation values.

Next conversion parameters may be decided, for example, by black-box optimization based on pairs of conversion parameters and the corresponding evaluation values. An optimization method to be employed may be the genetic algorithm, evolution strategy or covariance matrix adaptation evolution strategy (CMA-ES). Or the next conversion parameters may be decided by using Bayesian optimization.

Thereafter, using a conversion inverse function $\phi^{-1}(z)$, the next input parameters $x=\phi^{-1}(z)$ is calculated from the next conversion parameters z. Since the dimension number is set smaller in conversion $\phi(x)$ from the input parameters to the conversion parameters, there is a degree of freedom by the dimension number set smaller, in the conversion inverse function $\phi^{-1}(z)$. In this regard, the remaining freedom may be randomly decided. Or the remaining freedom may be decided to have a minimum distance to the input parameters for which the evaluation value is maximum (or minimum) at present. The decided next input parameters may be displayed on a display unit or directly output to the experimental device or the simulator 3, using communication equipment.

Until satisfying a predetermined condition, the repetition determiner 9 repeats the operations of the output data acquirer 4, the input/output data storage 5, the evaluation value calculator 6, the input parameter converter 7, and the next-input parameter decider 8. Satisfying the predetermined condition may, for example, be in such a case that the number of times of experiments or simulation goes over a threshold value, a case that the elapse time from the start of experiment or simulation goes over a threshold value, or a case that the evaluation value goes over (below) a threshold value. Or these cases may be combined.

Figure 5:
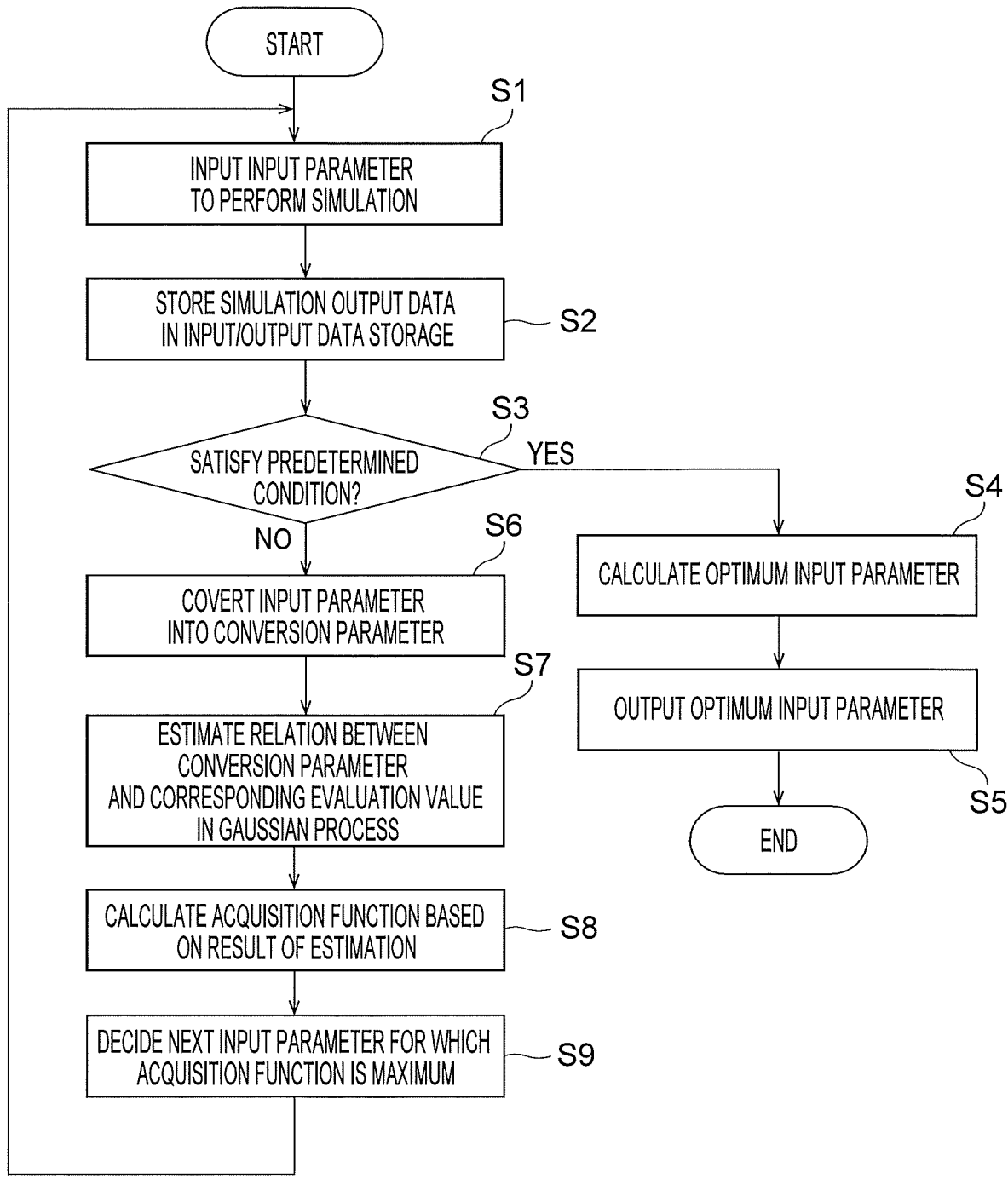
FIG. 5 is a flowchart showing an example of the operation of a simulation system.

FIG. 5 is a flowchart showing an example of the operation of the simulation system 2. First of all, input parameters are input to the simulator 3 to perform simulation (step S1). In step S1, the input parameters may be decided using Latin square or Sobol sequences.

Subsequently, output data expressing a result of simulation by the simulator 3 is acquired at the output data acquirer 4 and then the acquired output data is stored in the input/output data storage 5 (step S2). It is then determined at the repetition determiner 9 whether the predetermined condition is satisfied (step S3). If it is determined that the predetermined condition is satisfied, optimum input parameters are calculated (step S4), and then the optimum input parameters are output (step S5). In step S4, for example, input parameters for which the evaluation value calculated by the evaluation value calculator 6 are maximum (or minimum) may be decided as the optimum input parameters. As described above, the optimization apparatus 1 of FIG. 1 may be provided with an optimum input-parameter outputter.

If it is determined that the predetermined condition is not satisfied in step S3, the input parameters are converted into conversion parameters at the input parameter converter 7 (step S6). Specifically, the input parameters are converted into conversion parameters of a smaller dimension number than the dimension number of the input parameters.

Subsequently, at the next-input parameter decider 8, next input parameters are decided based on a pair of the conversion parameters and the corresponding evaluation value (steps S7 to S9). For example, when using Bayesian optimization, a relationship between the conversion parameters and the corresponding evaluation value is estimated in the Gaussian process (step S7). Based on a result of estimation in step S7, an acquisition function is calculated (step S8). Lastly, next input data is decided so that the acquisition function becomes maximum (step S9). Thereafter, the repetition determiner 9 repeats step S1 and the following steps until the predetermined condition is satisfied.

As described above, in the first embodiment, conversion parameters are generated by reducing the dimension number of input parameters, and then the next input parameters are decided based on the conversion parameters and the corresponding evaluation values, and, until the predetermined condition is satisfied, the execution of simulation, the generation of conversion parameters, and the decision of next input parameters are repeated, so that optimum input parameters for use in simulation can be decided with a small number of times of simulation.

Second Embodiment

Figure 6:
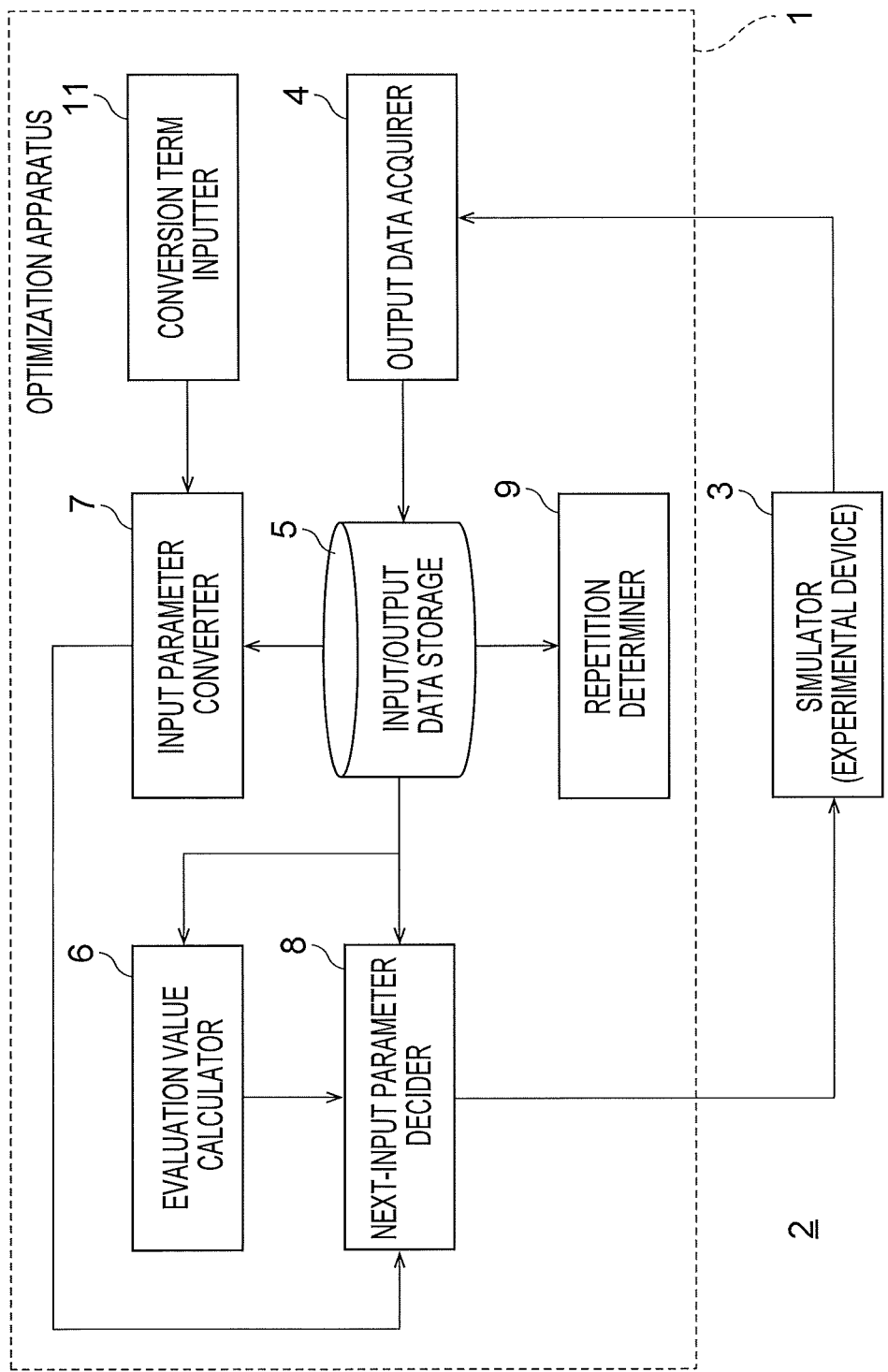
FIG. 6 a block diagram schematically showing the configuration of an optimization apparatus according to a second embodiment.

FIG. 6 a block diagram schematically showing the configuration of an optimization apparatus 1 according to a second embodiment. The optimization apparatus 1 of FIG. 6 is equivalent to the optimization apparatus 1 of FIG. 1, except for being provided with a conversion term inputter 11 instead of the conversion dimension-number inputter 10 of FIG. 1.

The conversion term inputter 11 inputs any term name as a conversion term, among term names of output data output from the simulator 3. The conversion term inputter 11 may directly input any term of the output data or may select any term from a list of term names of the output data. Moreover, the conversion term inputter 11 may change the conversion term during the operation of the optimization apparatus 1. Or the conversion term inputter 11 may be restricted so that it cannot change the conversion term once input during the operation of the optimization apparatus 1. Moreover, it may be planned in advance to gradually increase the conversion terms as the optimization proceeds.

Figure 7:
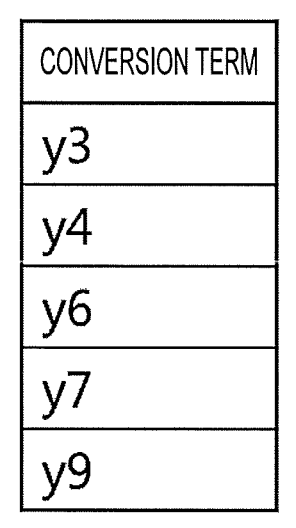

FIG. 7 is a figure showing an example of conversion terms input by the conversion term inputter 11. The example shown in FIG. 7 is such that, when the output data of the simulator 3 has ten terms of y1, y2, . . . , and y10 in total, among them, five terms of y3, y4, y6, y7, and y9 are selected as conversion terms. The number of conversion terms input by the conversion term inputter 11 is equal to the conversion dimension number.

The input parameter converter 7 converts input parameters stored in the input/output data storage 5 to conversion parameters based on the conversion term input by the conversion term inputter 11. In the example of FIG. 7, a regression equation $y'=\phi(x)$ that predicts the conversion terms of $y'=(y3, y4, y6, y7, y9)$ input by the conversion term inputter 11 and a result of the regression $z=\phi(x)$ is decided as the conversion parameters. In other words, pairs of y' and $\phi(x)$ are calculated from the input and output data to obtain $\phi(x)$ that has a smaller error between y' and $\phi(x)$.

For example, the square root sum of squares of errors between y' and $\phi(x)$ may be calculated to obtain $\phi(x)$ with which the calculated square root sum of squares becomes minimum. The regression may be linear regression, Lasso regression, elastic net regression, random forest regression, and so on. The conversion method of the input parameter converter 7 may be changed for each experiment or simulation, or may be fixed. Moreover, the conversion method of the input parameter converter 7 may be changed for each predetermined number of times of experiments or simulation.

Both of the conversion dimension-number inputter 10 of FIG. 1 and the conversion term inputter 11 of FIG. 6 may be provided in the optimization apparatus 1. In this case, when the conversion dimension number input by the conversion dimension-number inputter 10 and the number of conversion terms input by the conversion term inputter 11 are equal to each other, the input parameter converter 7 performs the same process as the input parameter converter 7 in the optimization apparatuses 1 of FIGS. 1 and 6. An error may be output when the conversion dimension number input by the conversion dimension-number inputter 10 and the number of conversion terms input by the conversion term inputter 11 are not equal to each other.

When the conversion dimension number input by the conversion dimension-number inputter 10 is smaller than the number of conversion terms input by the conversion term inputter 11, the input parameter converter 7 may select conversion terms, the number of which is equal to the conversion dimension number, from among the conversion terms input by the conversion term inputter 11. In this case, the input parameter converter 7 finds out regression that predicts the selected conversion terms and then decides this result of regression as the conversion parameters. For example, when there are five conversion terms of y3, y4, y6, y7 and y9, and the conversion dimension number is 3, the selected conversion terms are, for example, three conversion terms of y3, y4 and y9. The selection of terms, the number of which is equal to the conversion dimension number, from among conversion terms, may be performed randomly or performed so as to give smaller correlation between the selected conversion terms.

When the conversion dimension number input by the conversion dimension-number inputter 10 is larger than the number of conversion terms input by the conversion term inputter 11, the input parameter converter 7 may select new terms, the number of which is equal to the difference between the conversion dimension number and the number of conversion terms, from among the terms of output data that are not input by the conversion term inputter 11. In this case, the input parameter converter 7 finds out regression that predicts the new terms of the selected output data and the conversion terms input by the conversion term inputter 11 and then decides this result of regression as the conversion parameters. For example, when there are ten terms of y1, . . . , and y10 in the output data and five conversion terms of y3, y4, y6, y7 and y9, and the conversion dimension number is 7, two terms, the number of which is the difference between the conversion dimension number and the conversion terms, are selected from among output data terms y1, y2, y5, y8 and y10, except for the conversion terms. For example, there are two selected output data terms of y1 and y5, and then regression is find out which predicts seven terms of y1, y3, y4, y5, y6, y7 and y9 which are a combination of the two selected output data terms and the conversion terms. The selection of output data terms may be performed randomly or performed so as to give smaller correlation between the output data terms and the conversion terms.

Moreover, when the conversion dimension number input by the conversion dimension-number inputter 10 is larger than the number of conversion terms input by the conversion term inputter 11, the input parameter converter 7 may convert conversion parameters, the number of which is equal to the conversion terms, using a result of regression, and convert other conversion parameters, the number of which is equal to the difference between the remaining conversion dimension numbers and the number of conversion terms, with a different method. For example, when there are five conversion terms of y3, y4, y6, y7 and y9, the conversion dimension number is 7, the conversion parameters z1, . . . , z7, z1, . . . , z5 may be obtained by using the regression y'=ϕ(x) for predicting the selected output data y'=(y3, y4, y6, y7, y8), where a result of the regression is ϕ(x). On the other hand, the conversion parameters z6 and z7 may be obtained by using ϕ'(x) different from the regression ϕ(x). ϕ'(x) may be obtained, for example, using principal component analysis (PCA). Or conversion parameters may be converted as z=Ax using a random matrix A. Moreover, conversion may be performed using the multi-dimensional scaling, the self-organizing map, etc. Or the remaining conversion parameters may be calculated so as to have smaller correlation with the calculated conversion parameters z1, . . . , z5 (or so as to be quadrature to z1, . . . , z5).

As described above, in the second embodiment, the conversion term inputter 11 is provided instead of the conversion dimension-number inputter 10, output data terms for conversion of input parameters into conversion parameters can be directly assigned, so that a conversion process to conversion parameters can be performed quickly.

Third Embodiment

The next-input parameter decider 8 has output-result estimation function, an acquisition-function calculating function, and an acquisition-function maximizing function.

The output-result estimation function estimates post probability p(y|z) of evaluation values y that are calculated according to the Bayes' rule with respect to conversion parameters z, based on pairs of conversion parameters and the corresponding evaluation values. The acquisition-function calculating function calculates an acquisition function based on the post probability calculated according to the Bayes' rule. The calculation of the acquisition function may be performed, for example, using PI (Probability of Improvement), EI (Expected Improvement), UCB (Upper Confidence Bound), TS (Thompson Sampling), ES (Entropy Search) or MI (Mutual Information). For example, in the case of PI, an acquisition function $\alpha_n(z)$ is calculated by the following expression (1) using any given constant $\tau_n$.

$$\alpha_n(z) = \int_{\tau_n}^{\infty} p(y|z) dy \quad (1)$$

The acquisition-function maximizing function is to calculate next input parameters for which the acquisition function becomes maximum. For example, conversion parameters $z_{n+1} = \text{argmax}_z \alpha_n(z)$ for which the acquisition function becomes maximum may be obtained and, using an inverse function $\phi^{-1}(z)$ of conversion $\phi$, the next input parameters may be calculated as $x_{n+1} = \phi^{-1}(z_{n+1})$. Since the dimension number is set smaller in conversion, there is a degree of freedom by the dimension number set smaller, in the conversion inverse function. In this regard, the remaining freedom may be randomly decided. Or the remaining freedom may be decided to give a minimum distance to the input parameters for which the evaluation value is maximum (or minimum) at present moment. Or the acquisition function may be treated as a function of input parameters x, such as $\alpha_n(\phi(x))$, and input parameters $x_{n+1} = \text{argmax}_z \alpha_n(\phi(x))$ for which the acquisition function becomes maximum may be directly calculated. In this method, since the inverse conversion $\phi^{-1}(z)$ is not required, conversion $\phi$, for which inverse conversion cannot be calculated, can be used. The acquisition function maximization may be performed using any maximization method. For example, exhaustive search, random search, grid search, gradient method, L-BFGS, DIRECT, CMA-ES, multi-start local search, etc. may be used.

Fourth Embodiment

A fourth embodiment is to decide next input parameters with Bayesian optimization. The configuration of an optimization apparatus 1 according to the fourth embodiment is the same as that schematically shown in FIG. 1, and hence the explanation of the block configuration will be omitted.

The next-input parameter decider 8 according to the fourth embodiment has an output-result estimation function, an acquisition-function calculating function, and an acquisition-function maximizing function.

The output-result estimation function estimates a relational expression of the conversion parameters and a mean value of the corresponding evaluation values and a relational expression of the conversion parameters and variance of the corresponding evaluation values, based on pairs of the conversion parameters and the corresponding evaluation values. As for the estimation method of the relational expression of mean value and variance, Gaussian process regression or random forest regression may be used. For example, in the case of Gaussian process regression, conversion parameters and an evaluation value in an i-th experiment are expressed as zi and yi, respectively, with a mean value vector of evaluation values and covariance of zi and zj being expressed as $mi = \mu_0(zi)$ and $Ki, j = k(zi, zj)$, respectively. Here, $\mu_0(zi)$ is any given function and $k(zi, zj)$ is any kernel function which may, for example, be squared exponential kernel, Matern kernel or linear kernel.

In the case of above, a relational expression $\mu_n(z)$ of conversion parameters z and the mean value of evaluation values y is expressed as $\mu_n(z) = \mu_0(z) + k(z)^T(K + \sigma^2 I)^{-1}(y - m)$, on condition of $ki(z) = k(z, zi)$, with $\sigma^2$ being any constant. A relational expression $\sigma_n^2(z)$ of the conversion parameters z and variance of the evaluation values y is expressed as $\sigma_n^2(z) = k(z, z) - k(z)^T(K + \sigma^2 I)^{-1}k(z)$.

The acquisition-function calculation function calculates an acquisition function based on the relational expression of mean value and the relational expression of variance. As for the calculation of acquisition function, for example, PI (Probability of Improvement), EI (Expected Improvement), UCB (Upper Confidence Bound), TS (Thompson Sampling), ES (Entropy Search), or MI (Mutual Information) may be used. For example, in the case of UCB, an acquisition function $\alpha_n(z)$ is calculated as $\alpha_n(z)=\mu_n(z)+\beta_n\sigma_n(z)$, using any given constant $\beta_n$.

The acquisition-function maximizing function is to calculate next input parameters for which the acquisition function becomes maximum. For example, conversion parameters $z_{n+1}=\mathrm{argmax}_z\alpha_n(z)$ for which the acquisition function becomes maximum may be obtained and, using an inverse function $\phi^{-1}(z)$ of conversion $\phi$, the next input parameters may be calculated as $x_{n+1}=\phi^{-1}(z_{n+1})$. Since the dimension number is set smaller in conversion, there is a degree of freedom by the dimension number set smaller, in the conversion inverse function. In this regard, the remaining freedom may be randomly decided. Or the remaining freedom may be decided to give a minimum distance to the input parameters for which the evaluation value is maximum (or minimum) at present moment. Or the acquisition function may be treated as a function of input parameters x, such as $\alpha_n(\phi(x))$, input parameters $x_{n+1}=\mathrm{argmax}_z\alpha_n(\phi(x))$ for which the acquisition function becomes maximum may be directly calculated. In this method, since the inverse conversion $\phi^{-1}(z)$ is not required, conversion $\phi$, for which inverse conversion cannot be calculated, can be used. The acquisition function maximization may be performed using any maximization method. For example, exhaustive search, random search, grid search, gradient method, L-BFGS, DIRECT, CMA-ES, multi-start local search, etc. may be used.

As described above, in the fourth embodiment, in performing Bayesian optimization, input parameters are converted into conversion parameters, the dimension number of which is reduced from the dimension number of the input parameters, and, based on the conversion parameters and the evaluation values, next input parameters are calculated. Therefore, irrespective of the dimension number of the input parameters, an input-parameter optimization process can be performed quickly.

Fifth Embodiment

A fifth embodiment is to visualize the conversion parameters.

Figure 8:
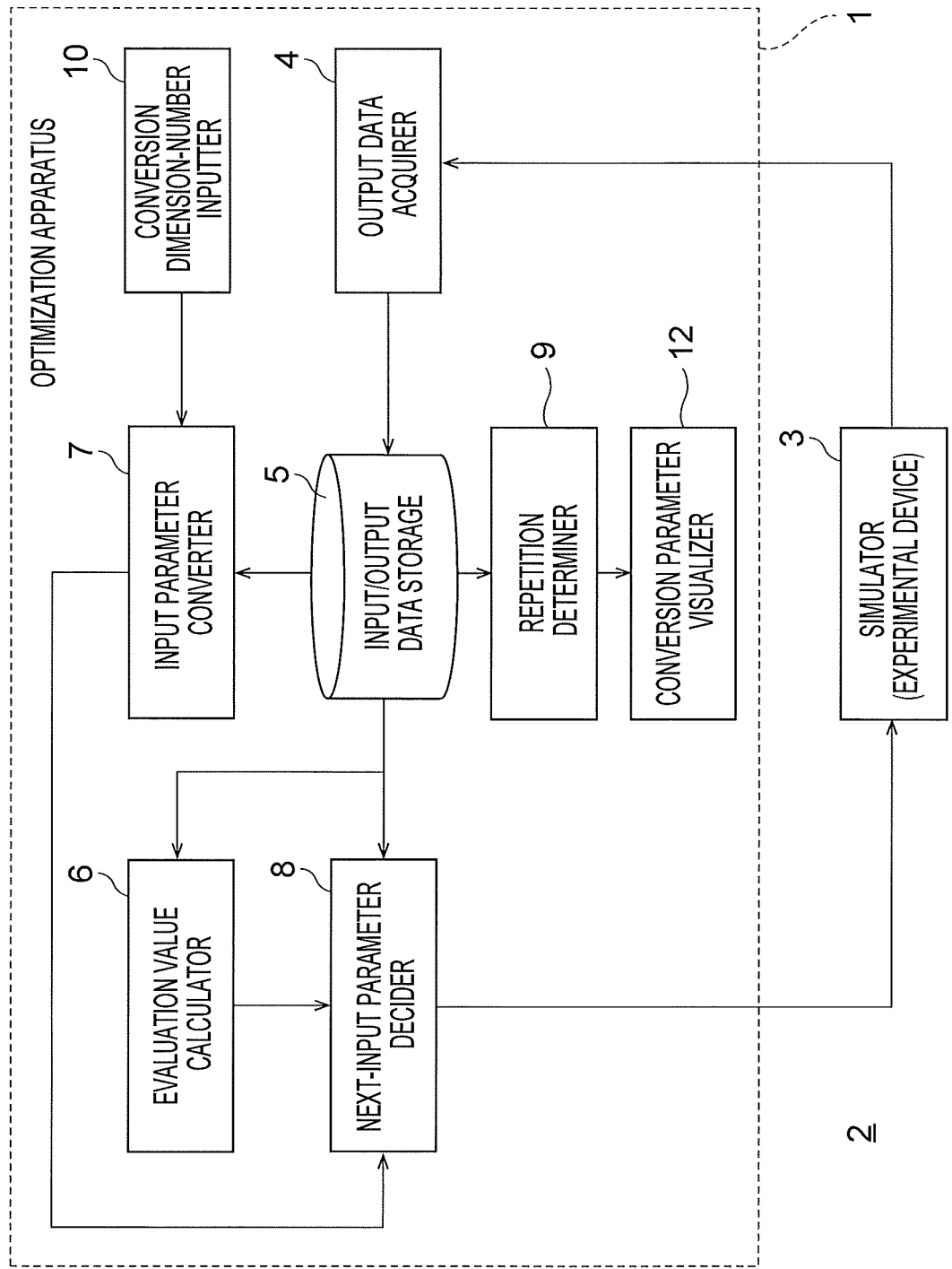
FIG. 8 is a block diagram schematically showing the configuration of an optimization apparatus according to a fifth embodiment.

FIG. 8 is a block diagram schematically showing the configuration of an optimization apparatus 1 according to the fifth embodiment. The optimization apparatus 1 of FIG. 8 is provided with a conversion parameter visualizer 12, added to the configuration of FIG. 1. The conversion parameter visualizer 12 visualizes at least one of data points of pairs of conversion parameters and the corresponding evaluation values, and an estimation relational expression of the conversion parameters and the corresponding evaluation values.

Figure 9:
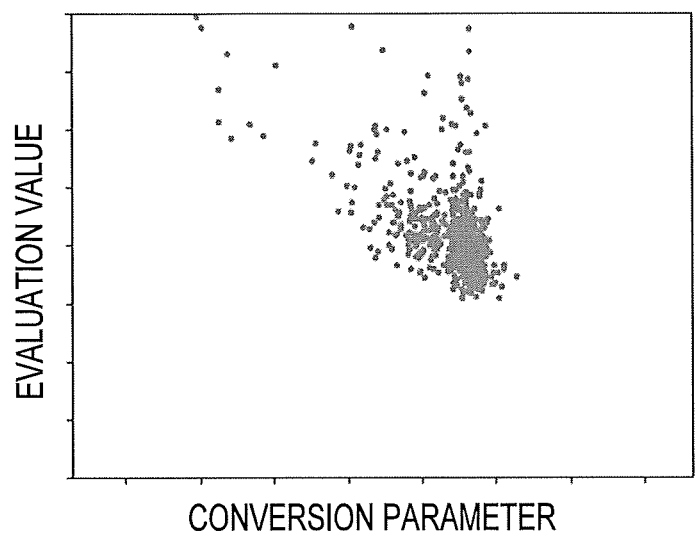
FIG. 9 is a figure showing a first example of visualization by a conversion parameter visualizer.

FIG. 9 is a figure showing a first example of visualization by the conversion parameter visualizer 12. In FIG. 9, the abscissa is the numerical value of one term of conversion parameters and the ordinate is the evaluation value. Each plot in FIG. 9 indicates the relationship between a numerical value of one term of the conversion parameters and the corresponding evaluation value. If the relationship between numerical values of the terms of the input parameters and the corresponding evaluation values is expressed as plots, the plots are evenly distributed on the two-dimensional coordinate plane, so that it is difficult to determine whether it is an optimum solution.

In contrast to the above, the plots in FIG. 9 are concentrated on a specific location on the two-dimensional coordinate plane. Therefore, by deciding next input parameters based on the conversion parameters and the evaluation values for which the plots are more concentrated, input parameter optimization can be performed quickly.

Figure 10:
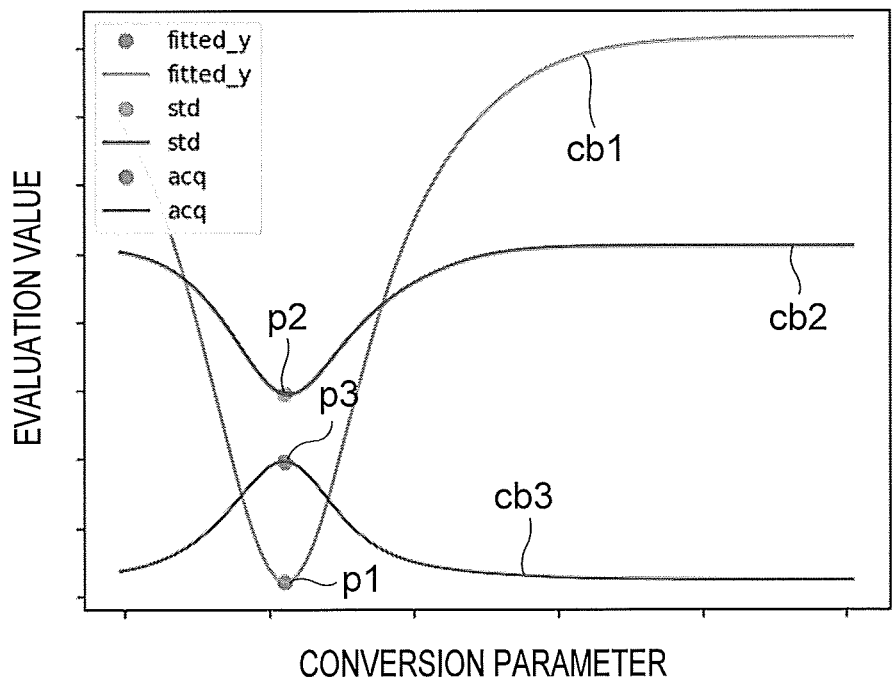
FIG. 10 is a figure showing a second example of visualization by the conversion parameter visualizer.

FIG. 10 is a figure showing a second example of visualization by the conversion parameter visualizer 12. In FIG. 10, the abscissa and the ordinate are the same as those of FIG. 9. In FIG. 10, a curve cb1, a curve cb2 and, a curve cb3 express a mean value $\mu_n(z)$, standard deviation (square root of variance) $\sigma_n(z)$, and an acquisition function $a_n(z)$, respectively. Plots on each curve express conversion parameters $z_{n+1}=\mathrm{argmax}_z a_n(z)$ for which the acquisition function becomes maximum. Plots p1, p2, and p3 express a mean value $\mu_n(z_{n+1})$ of evaluation values, standard deviation $\sigma_n(z_{n+1})$, and an acquisition function $a_n(z_{n+1})$, for conversion parameters $z_{n+1}$, respectively.

As described above, in the fifth embodiment, since the relationship between the conversion parameters and the corresponding evaluation values is visualized, whether the input parameters have been optimized can be visually grasped.

Sixth Embodiment

A sixth embodiment relates to the treatment of failed data acquired in experiment or simulation using input parameters.

Figure 11:
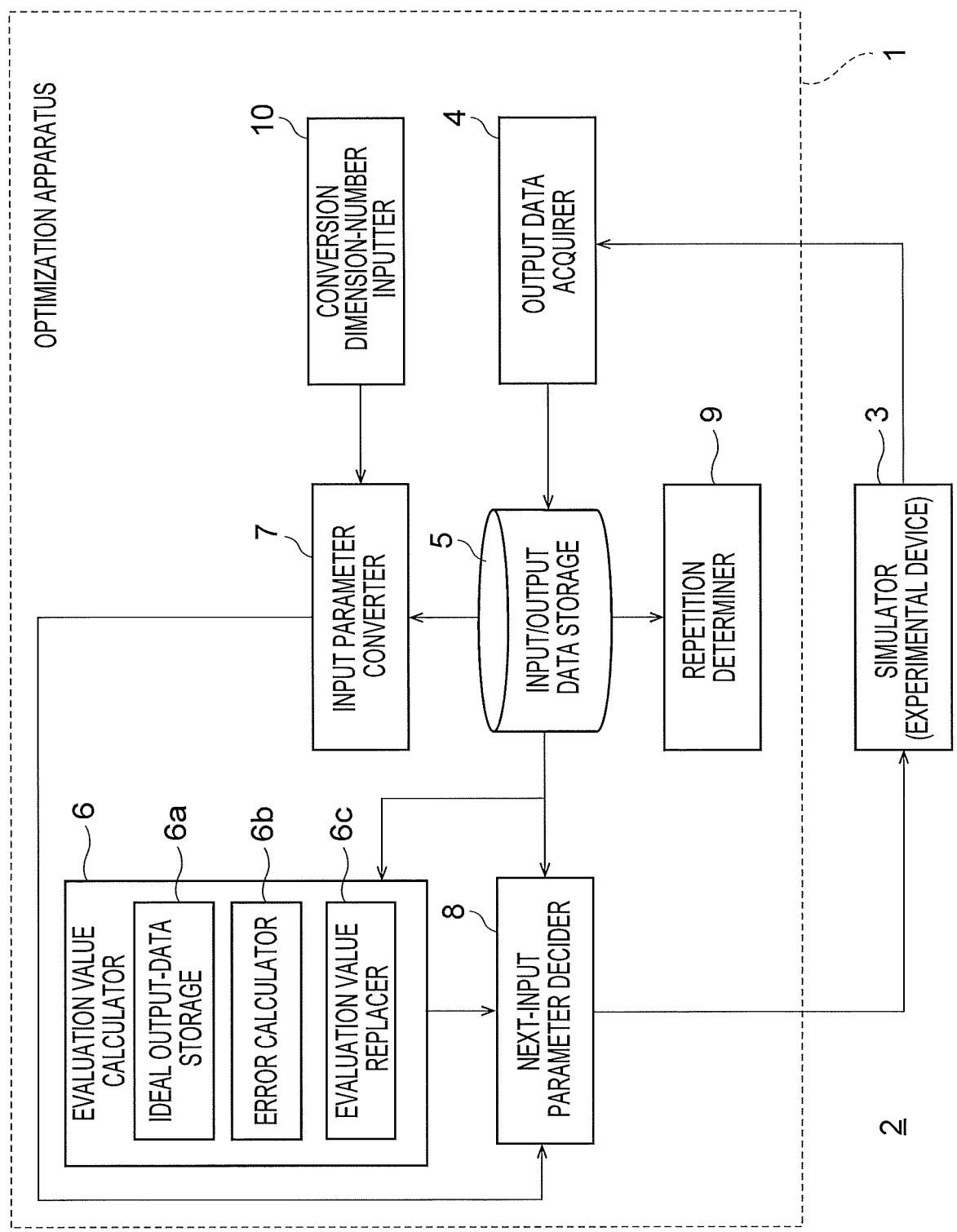
FIG. 11 is a block diagram of a simulation system provided with an optimization apparatus according to a sixth embodiment.

FIG. 11 is a block diagram of a simulation system 2 provided with an optimization apparatus 1 according to the sixth embodiment. The simulation system 2 of FIG. 11 is different from that of FIG. 1 in the internal configuration of the evaluation value calculator 6 in the optimization apparatus 1, the other configuration being the same as that of FIG. 1.

The evaluation value calculator 6 of FIG. 11 has ideal output-data storage 6a, an error calculator 6b, and an evaluation value replacer 6c. The ideal output-data storage 6a stores an ideal experiment or simulation output result. For example, when output data terms are y1, y2, . . . , y10, the ideal output result may be ten values that correspond to the ten terms or values of some of the terms.

The error calculator 6b calculates an error between experiment or simulation output data and an ideal output result, as an evaluation value. For example, when an i-th term output data obtained in experiment or simulation is expressed as yi and an i-th term ideal output result is expressed as yi bar (in the present specification, a sign with a lateral line above the sign is written as "sign bar"), an error y is expressed by the following expression (2).

$$y=\Sigma_i \|y_i - \overline{y_i}\| \qquad (2)$$

Here, $\|\ \|$ may be Lp norm shown in an expression (3) or infinity norm shown in an expression (4).

$$\|w\| = \sqrt[p]{\sum_j |w_j|^2} \qquad (3)$$

$$\|w\| = \max_j |w_j| \qquad (4)$$

The evaluation value replacer 6c may replace evaluation values in consideration of the occurrence of failure in experiment or simulation. The failure here means missing of part of output data with respect to input parameters. The failure is in such a case that, for example, there is no product in experiment and, as a result, part of output data is missing or a result is not returned due to a bug in simulation. It is also failure that output data is missing because a result of experiment exceeds an expectation so that measurement cannot be performed. Since the output data is missing, there are input parameters for which an evaluation value is a missing value. The evaluation value replacer 6c may replace an evaluation value, which corresponds to such input parameters for which the evaluation value is a missing value, with the maximum or minimum value of evaluation values of another experiment, with no missing. In other words, when $y_n$ expresses an evaluation value of an n-th experiment, which is not a missing value, $\min_n y_n$ or $\max_n y_n$ may be used in place of the missing evaluation value that corresponds to the input parameters.

For example, in the case of maximizing an evaluation value with respect to input parameters for which an experiment or simulation is failed, the evaluation value replacer 6c replaces the evaluation value in this case with a minimum value of evaluation values of another input parameters for which an experiment or simulation is not failed. Likewise, in the case of minimizing an evaluation value with respect to input parameters for which an experiment or simulation is failed, the evaluation value replacer 6c replaces the evaluation value in this case with a maximum value of evaluation values of another input parameters for which an experiment or simulation is not failed.

As described above, in the sixth embodiment, an evaluation value in the case where an experiment or simulation is failed with respect to input parameters is replaced based on an evaluation value of another input parameters for which an experiment or simulation is not failed. Therefore, even if an experiment or simulation is failed for some reasons, there is no possibility of performing optimization of input parameters based on an improper evaluation value.

The optimization apparatus 1 in each of the first to sixth embodiments is applicable to experiments and simulation on various events. As a specific example of application of the optimization apparatus 1 in each of the first to sixth embodiments, it is considered to optimize input parameters so that a semiconductor device has a predetermined shape. Current semiconductor devices are often processed into a desired shape with lithography or the like after a lot of films are stacked, under fine control of film forming conditions such as temperature and material. The optimization apparatus 1 in each of the first to sixth embodiments can be utilized to evaluate whether a finally obtained semiconductor device has a desired shape. In this case, the input parameters are the above-described film forming conditions. The input parameters include a plurality of terms such as a film forming temperature, materials and a film forming time. By adjusting these terms, the shape of a finally obtained semiconductor device varies. Therefore, by using the above-described optimization apparatus 1, optimum input parameters can be selected so that the semiconductor device has a desired shape.

At least part of the optimization apparatus 1 and the simulation system 2 explained in each above-described embodiment may be configured with hardware or software. When it is configured with software, a program that performs at least part of the functions of the optimization apparatus 1 and the simulation system 2 may be stored in a storage medium such as a flexible disk and CD-ROM, and then installed in a computer to run thereon. The storage medium may not be limited to a detachable one such as a magnetic disk and an optical disk but may be a standalone type such as a hard disk and a memory.

Moreover, a program that achieves at least part of the functions of the optimization apparatus 1 and the simulation system 2 may be distributed via a communication network a (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An optimization apparatus comprising processing circuitry configured to:
   acquire output data expressing a result of experiment or simulation based on input parameters;
   store the input parameters and the output data corresponding to the input parameters, as a pair;
   calculate evaluation values of the output data;
   generate conversion parameters of a dimension number reduced from the dimension number of the input parameters;
   decide next input parameters based on pairs of the conversion parameters and evaluation values corresponding to the conversion parameters;
   generate a conversion expression for converting the input parameters into the conversion parameters based on the input parameters and data of a conversion term partially assigned from terms of the output data;
   repeat operations of acquiring the output data, storing the input/output data, calculating the evaluation values, generating the conversion parameters, estimating a relationship between the conversion parameters and the evaluation values, and deciding the next-input parameter, until satisfying a predetermined condition;
   output input parameters having satisfied the predetermined condition as optimum input parameters including film forming conditions to be selected so that a semiconductor device has a desired shape: and
   process the semiconductor device into the desired shape based on the optimum input parameters including the film forming conditions.

2. The optimization apparatus of claim 1, wherein the processing circuitry is further configured to:
   calculate an acquisition function from the conversion parameters; and
   decide the next input parameters so that the acquisition function becomes maximum.

3. The optimization apparatus of claim 1, wherein the processing circuitry is further configured to:
   calculate an acquisition function based on a relational expression of the conversion parameters and a mean value of the corresponding evaluation values and a relational expression of the conversion parameters and variance of the corresponding evaluation values; and
   decide the next input parameters so that the acquisition function becomes maximum.

4. The optimization apparatus of claim 1 wherein the processing circuitry is further configured to visualize a correspondence relationship between the conversion parameters and the evaluation values.

5. The optimization apparatus of claim 4, wherein the processing circuitry is further configured to generate a graph of the evaluation values plotted per numerical value of each conversion parameter.

6. The optimization apparatus of claim 4, wherein the processing circuitry is further configured to illustrate a relational expression expressing the correspondence relationship between the conversion parameters and the evaluation values.

7. The optimization apparatus of claim 1, wherein the processing circuitry is further configured to:
store ideal data including an ideal experiment or simulation result; and
calculate an error between the output data and the ideal data as the evaluation value.

8. The optimization apparatus of claim 1, wherein the processing circuitry is further configured to:
determine whether the output data is missing; and
replace an evaluation value corresponding to at least one of a plurality of input parameters based on an evaluation value corresponding to another input parameters for output data not missing, when output data corresponding to the at least one of the plurality of input parameters is determined as missing.

9. The optimization apparatus of claim 1, wherein, when the output data corresponding to the at least one of a plurality of input parameters is determined as missing, the processing circuitry is further configured to replace an evaluation value to be maximized with a minimum value of an evaluation value of the other input parameters or replace an evaluation value to be minimized with a maximum value of the evaluation value of the other input parameters.

10. The optimization apparatus of claim 1, wherein the conversion expression is a regression equation that predicts data of the partial conversion term from the input parameters.

11. A simulation system comprising:
a simulator to perform simulation based on input parameters to output a result of simulation; and
an optimlzauon apparatus to optimize the input parameters,
wherein the optimization apparatus comprises processing circuitry configured to:
acquire output data expressing a result of simulation by the simulator based on input parameters;
store the input parameters and the output data corresponding to the input parameters, as a pair;
calculate evaluation values of the output data;
generate conversion parameters of a dimension number reduced from the dimension number of the input parameters;
decide next input parameters based on pairs of the conversion parameters and evaluation values corresponding to the conversion parameters;
generate a conversion expression for converting the input parameters into the conversion parameters based on the input parameters and data of a partial conversion term assigned from terms of the output data;
repeat operations of acquiring the output data, storing the input/output data, calculating the evaluation values, generating the conversion parameters, estimating a relationship between the conversion parameters and the evaluation values, and deciding the next-input parameter, until satisfying a predetermined condition;
output input parameters having satisfied the predetermined condition as optimum input parameters including film firming conditions to be selected so that a semiconductor device has a desired shape: and
process the semiconductor device into the desired shape based on the optimum input parameters including the film forming conditions.

12. The simulation system of claim 11, wherein the processing circuitry is further configured to:
calculate an acquisition function from the conversion parameters; and
decide the next input parameters so that the acquisition function becomes maximum.

13. The simulation system of claim 11, wherein the processing circuitry is further configured to:
calculate an acquisition function based on a relational expression of the conversion parameters and a mean value of the corresponding evaluation values and a relational expression of the conversion parameters and variance of the corresponding evaluation values; and
decide the next input parameters so that the acquisition function becomes maximum.

14. The simulation system of claim 11, wherein the processing circuitry is further configured to visualize a correspondence relationship between the conversion parameters and the evaluation values.

15. A simulation method on a computer, the method comprising:
acquiring output data expressing a result of experiment or simulation based on input parameters;
storing the input parameters and the output data corresponding to the input parameters, as a pair;
calculating evaluation values of the o pit data;
generating conversion parameters of a dimension number reduced from the dimension number of the input parameters;
deciding next input parameters based on pairs of the conversion parameters and evaluation values corresponding to the conversion parameters;
generating a conversion expression for converting the input parameters into the conversion parameters based on the input parameters and data of a conversion term partially assigned from terms of the output data;
repeating the acquiring, the storing, the calculating, the generating the conversion parameters, and the deciding, until satisfying a predetermined condition;
outputting input parameters having satisfied the predetermined condition as optimum input parameters including film forming conditions to be selected so that a semiconductor device has a desired shape: and
processing the semiconductor device into the desired shape based on the optimum input parameters including the film forming conditions.

* * * * *